(12) United States Patent
Jamneala et al.

(10) Patent No.: US 7,612,636 B2
(45) Date of Patent: Nov. 3, 2009

(54) IMPEDANCE TRANSFORMING BULK ACOUSTIC WAVE BALUNS

(75) Inventors: Tiberiu Jamneala, San Francisco, CA (US); John D. Larson, III, Palo Alto, CA (US); Richard Ruby, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 322 days.

(21) Appl. No.: 11/343,117

(22) Filed: Jan. 30, 2006

(65) Prior Publication Data

US 2007/0176710 A1    Aug. 2, 2007

(51) Int. Cl.
*H03H 9/54* (2006.01)
*H03H 9/60* (2006.01)

(52) U.S. Cl. .................... 333/189; 333/191
(58) Field of Classification Search .......... 333/191, 333/189, 192, 187, 188
See application file for complete search history.

(56) References Cited

U.S. PATENT DOCUMENTS

| | | | |
|---|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |

(Continued)

FOREIGN PATENT DOCUMENTS

EP    0637875    2/1995

(Continued)

OTHER PUBLICATIONS

U.S. Appl. No. 10/971,169, filed Oct. 22, 2004, Larson III, John D., et al.

(Continued)

*Primary Examiner*—Dean O Takaoka (57) ABSTRACT

A bulk acoustic wave device includes an acoustic decoupler between first and second film bulk acoustic resonators (FBARs). The first FBAR is resonant at a resonant frequency of the device and includes first and second planar electrodes abutting opposite sides of a first resonator volume free of any intervening electrodes and containing piezoelectric material disposed for acoustic vibrations parallel to a propagation axis normal to the first and second electrodes. The first FBAR has a first electrical impedance parallel to the propagation axis. The second FBAR is resonant at the resonant frequency and includes third and fourth planar electrodes abutting opposite sides of a second resonator volume free of any intervening electrodes and containing piezoelectric material disposed for acoustic vibrations parallel to the propagation axis. The second FBAR has a second electrical impedance parallel to the propagation axis and different from the first electrical impedance.

19 Claims, 4 Drawing Sheets

U.S. PATENT DOCUMENTS

| | | |
|---|---|---|
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,633,574 A | 5/1997 | Sage |
| 5,671,242 A | 9/1997 | Takiguchi et al. |
| 5,692,279 A | 12/1997 | Mang et al. |
| 5,705,877 A | 1/1998 | Shimada |
| 5,714,917 A | 2/1998 | Ella |
| 5,789,845 A | 8/1998 | Wadaka et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,060,818 A | 5/2000 | Ruby et al. |
| 6,087,198 A | 7/2000 | Panasik |
| 6,107,721 A | 8/2000 | Lakin |
| 6,111,341 A | 8/2000 | Hirama |
| 6,111,480 A | 8/2000 | Iyama et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,215,375 B1 | 4/2001 | Larson, III et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,550,664 B2 | 4/2003 | Bradley et al. |
| 6,559,487 B1 | 5/2003 | Kang et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 * | 12/2003 | Ella et al. .................. 333/133 |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |

| | | |
|---|---|---|
| 6,738,267 B1 | 5/2004 | Navas Sabater et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,842,089 B2 | 1/2005 | Lee |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,128,941 B2 | 10/2006 | Lee |
| 7,138,889 B2 * | 11/2006 | Lakin .................. 333/189 |
| 7,161,448 B2 | 1/2007 | Feng et al. |
| 7,170,215 B2 | 1/2007 | Namba et al. |
| 7,173,504 B2 | 2/2007 | Larson |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,259,498 B2 | 8/2007 | Nakatsuka et al. |
| 7,276,994 B2 | 10/2007 | Takeuchi et al. |
| 7,281,304 B2 | 10/2007 | Kim et al. |
| 7,310,861 B2 | 12/2007 | Aigner et al. |
| 7,367,095 B2 | 5/2008 | Larson, III et al. |
| 7,369,013 B2 | 5/2008 | Fazzio et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,408,428 B2 | 8/2008 | Larson, III |
| 7,414,349 B2 | 8/2008 | Sasaki |
| 7,414,495 B2 | 8/2008 | Iwasaki et al. |
| 7,439,824 B2 | 10/2008 | Aigner |
| 2002/0000646 A1 | 1/2002 | Gooch et al. |
| 2002/0030424 A1 | 3/2002 | Iwata |
| 2002/0063497 A1 | 5/2002 | Panasik |
| 2002/0121944 A1 | 9/2002 | Larson, III et al. |
| 2002/0121945 A1 | 9/2002 | Ruby et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0141946 A1 | 7/2003 | Ruby et al. |
| 2003/0179053 A1 | 9/2003 | Aigner et al. |
| 2004/0016995 A1 | 1/2004 | Kuo et al. |
| 2004/0056735 A1 | 3/2004 | Nomura et al. |
| 2004/0092234 A1 | 5/2004 | Pohjonen |
| 2004/0124952 A1 | 7/2004 | Tikka |
| 2004/0150296 A1 | 8/2004 | Park et al. |
| 2004/0195937 A1 | 10/2004 | Matsubara et al. |
| 2004/0212458 A1 | 10/2004 | Lee |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 * | 1/2005 | Korden et al. ............... 333/189 |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093653 A1 | 5/2005 | Larson, III et al. |
| 2005/0093654 A1 | 5/2005 | Larson, III et al. |
| 2005/0093655 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0218488 A1 | 10/2005 | Matsuo |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0125489 A1 | 6/2006 | Feucht et al. |
| 2006/0132262 A1 | 6/2006 | Fazzio et al. |
| 2006/0164183 A1 | 7/2006 | Tikka |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson et al. |
| 2006/0290446 A1 | 12/2006 | Aigner et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |

| | | | |
|---|---|---|---|
| 2008/0055020 | A1 | 3/2008 | Handtmann |

FOREIGN PATENT DOCUMENTS

| | | |
|---|---|---|
| EP | 637875 | 2/1995 |
| EP | 689254 | 12/1995 |
| EP | 0865157 | 9/1998 |
| GB | 2013343 | 8/1979 |
| GB | 2411239 | 8/2005 |
| GB | 2418791 | 4/2006 |
| GB | 2427773 | 1/2007 |
| JP | 61054686 | 3/1986 |
| JP | 2002/217676 | 8/2002 |
| WO | WO-01/06647 | 1/2001 |
| WO | WO-01/99276 | 12/2001 |
| WO | WO-02/103900 | 12/2002 |
| WO | WO-03/043188 | 5/2003 |
| WO | WO-03/058809 | 7/2003 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

Holzlohner, Ronald et al., "Accurate Calculation of Eye Diagrams and Bit Error Rates in Optical Transmission Systems Using Linearization", *Journal of Lightwave Technology*, vol. 20, No. 3., (Mar. 2002),pp. 389-400.
Reinhardt, Alexandre et al., "Design of Coupled Resonator Filters Using Admittance and Scattering Matrices", *2003 IEEE Ultrasonics Symposium*, (May 3, 2003),1428-1431.
Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).
Navas, J. et al., "Miniaturised Battery Charger using Piezoelectric Transformers", *IEEE*, (2001),492-496.
Jiang, Yimin et al., "A Novel Single-Phase Power Factor Correction Scheme", *IEEE*, (1993),287-292.
Lakin, K.M. "Coupled Resonator Filters", *2002 IEEE Ultrasonics Symposium*, (Mar. 2, 2002),901-908.
Lakin, K.M. et al., "High Performance Stacked Crystal Filters for GPS and Wide Bandwidth Applications", *2001 IEEE Ultrasonics Symposium*, (Jan. 1, 2001),833-838.
Krishnaswamy, S.V. et al., "Film Bulk Acoustic Wave Resonator Technology", (May 29, 1990),529-536.
Lobl, H.P. et al., "Piezoelectric Materials For BAW Resonators And Filters", *2001 IEEE Ultrasonics Symposium*, (Jan. 1, 2001),807-811.
Lakin, K.M. "Bulk Acoustic Wave Coupled Resonator Filters", *2002 IEEE International Frequency Control Symposium and PDA Exhibition*, (Jan. 2, 2002),8-14.
Jung, Jun-Phil et al., "Experimental And Theoretical Investigation On The Relationship Between AlN Properties And AlN-Based FBAR Characteristics", *2003 IEEE International Frequency Control Symposium and PDA Exhibition Jointly with the 17th European Frequency and Time Forum*, (Sep. 3, 2003),779-784.
Yang, C.M. et al., "Highly C Axis Oriented AlN Film Using MOCVD For 5GHx Band FBAR Filter", *2003 IEEE Ultrasonics Symposium*, (Oct. 5, 2003),pp. 170-173.
Martin, Steven J., et al., "Development Of A Low Dielectric Constant Polymer For The Fabrication Of Integrated Circuit Interconnect", *12 Advanced Materials*, (Dec. 23, 2000),1769-1778.
Hadimioglu, B. et al., ""Polymer Films As Acoustic Matching Layers".", *1990 IEEE Ultrasonics Symposium Proceedings*, vol. 3 PP., [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.
"Search Report from corresponding application No.", GB 0605779. 8, (Aug. 23, 2006).
"Examination Report from UK for application", GB 0605971.1, (Aug. 24, 2006).

"Examination report corresponding to application No.", GB0605770.7, (Aug. 25, 2006).
"Examination Report corresponding to application No.", GB0605775.6, (Aug. 30, 2006).
"Search report from corresponding application No.", GB0620152.9, (Nov. 15, 2006).
"Search report from corresponding application No.", GB0620655.1, (Nov. 17, 2006).
"Search report from corresponding application No.", GB0620653.6, (Nov. 17, 2006).
"Search Report from corresponding application No.", GB0620657.7, (Nov. 23, 2006).
Coombs, Clyde F., et al., "Electronic Instrument Handbook", Second Edition, McGraw-Hill, Inc., (1995),pp. 5.1 to 5.29.
"A partial copy of GB Search Report for", Application No. GB0522393.8, (Jan. 9, 2006),4 pages.
"A partial copy of GB Search Report for Application No.", GB0525884.3, (Feb. 2, 2006),4 pgs.
Auld, B. A., "Acoustic Resonators", *Acoustic Fields and Waves in Solids, Second Edition*, vol. II, (1990),250-259.
"British Search Report Application No.", 0605222.9, (Jul. 11, 2006).
Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys. 54 (10)*, (Oct. 1983),5893-5910.
"Search Report from corresponding application", No. GB0605225.2.
"Search Report for Great Britain Patent Application", No. 0617742. 2, (Mar. 29, 2007).
"Search Report for Great Britain Patent Application", No. 0617742. 2, (Dec. 13, 2006).
"Search Report in the Great Britian Patent Application", No. 0619698.4, (Nov. 30, 2006).
Ruby, R. et al., "The Effect of Perimeter Geometry on FBAR Resonator Electrical Performance", *Microwave Symposium Digest, 2005 IEEE MTT-S International*, (Jun. 12, 2005),217-221.
Schuessler, Hans H., "Ceramic Filters and Resonators", *Reprinted from IEEE Trans. Sonics Ultrason.*, vol. SU-21, (Oct. 1974),257-268.
Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.
Choi, Sungjin et al., "Design of Half-Bridge Piezo-Transformer Converters in the AC Adapter Applications", *IEEE 2005*, 244-248.
Li, Yunxiu et al., "AC-DC Converter with Worldwide Range Input Voltage by Series and Parallel Piezoelectric Transformers Connection", *35th Annual IEEE Power Electronics Specialists Conference*, (2004).
Aoyama, Takayuki et al., "Diffusion of Boron, Phosphorous, Arsenic and Antimony in Thermally Grown Silicon Dioxide", *Journal of The Electrochemical Society*, vol. 146, No. 5 1999, 1879-1883.
Bauer, L. O. et al., "Properties of Silicon Implanted with Boron Ions through Thermal Silicon Dioxide", *Solid State Electronics*, vol. 16, No. 3 Mar. 1973, 289-300.
Hara, K., "Surface Treatment of Quartz Oscillator Plate by Ion Implantation", *Oyo Buturi*, vol. 47, No. 2 Feb. 1978, 145-146.
Lakin, K. M. et al., "Temperature Compensated Bulk Acoustic Thin Film Resonators", *IEEE Ultrasonics Symposium*, San Juan, Puerto Rico Oct. 2000, 855-858.
Lakin, K.M., "Thin Film BAW Filters for Wide Bandwidth and High Performance Applications", *IEEE Microwave Symposium Digest*; vol. 2 Jun. 6-11, 2004, 923-926.
Lakin, K. M., "Thin Film Resonators and Filters", *IEEE Untrasonics Symposium*, Caesar's Tahoe, NV Oct. 1999, 895-906.
Lakin, et al., "Wide Bandwidth Thin Film BAW Filters", *2004 IEEE Ultrasonics Symposium*, vol. 1, Aug. 2004, 407-410.
Larson III, John D. et al., "Measurement of Effective Kt2,Q,Rp,Rs vs. Temperature for Mo/AlN FBAR Resonators", *IEEE Ultrasonics Symposium* 2002, 939-943.
NG, J. et al., "The Diffusion Ion-Implanted Boron in Silicon Dioxide", *AIP Conf. Proceedings*, No. 122 1984, 20-33.
Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pang, W. et al., "High Q Single-Mode High-Tone Bulk Acoustic Resonator Integrated With Surface-Machined FBAR Filter", *Microwave Symposium Digest IEEE MTT-S International* 2005, 413-416.

Parker, T. E. et al., "Temperature-Compensated Surface Acoustic-Wave Devices with SiO2 Film Overlays", *J. Appl. Physics*, vol. 50 1360-1369, Mar. 1979.

Ruby, R. C., "MicroMachined Thin Film Bulk Acoustic Resonators", *IEEE International Frequency Control Symposium* 1994, 135-138.

Sanchez, A.M. et al., "Mixed analytical and numerical design method for piezoelectric transformers", *IEEE,PESX* Jun. 2003, 841-846.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Topich, J. A. et al., "Effects of Ion Implanted Flourine in Silicon Dioxide", *Nuclear Instr. And Methods, Cecon Rec*, Cleveland, OH May 1978, 70-73.

Tsubbouchi, K. et al., "Zero Temperature coefficient Surface Acoustic Wave Devices using Epitaxial AlN Films", *IEEE Ultrasonic symposium*, San Diaego, CA, 1082 1982, 240-245.

Vasic, D et al., "A New Method to Design Piezoelectic Transformer Used in MOSFET & IGBT Drive Circuits", *IEEE 34th Annual Power Electronics Specialists Conference*, 2003 vol. 1 Jun. 15-19, 2003, 307-312.

Vasic, D et al., "A New MOSFET & IGBT Gate Drive Insulated By A Piezoelectric Transformer", *IEEE 32nd Annual Power Electronics Specialists Conference*, 2001 vol. 3 2001, 1479-1484.

Coombs, Clyde F., "Electronic Instrument Handbook", *Second Edition, McGraw-Hill, Inc.*, (1995),pp. 5.1 to 5.29.

Auld, B. A., "Acoustic Resonators", *Acoustic Fields and Waves in Solids, Second Edition*, vol. II, (1990),250-259.

Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Navas, J. et al., "Miniaturised Battery Charger using Piezoelectric Transformers", *IEEE*, (2001),492-496.

\* cited by examiner

Figure 1:
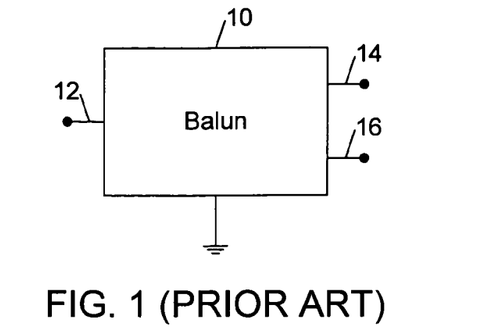
FIG. 1 is a block diagram of a prior art balun.

FIG. 8 ically are characterized by superior immunity to electromagnetic interference, power supply noise and ground noise relative to unbalanced components. The balun 10 also typically passively transforms the impedance between the single-ended port 12 and the two differential ports 14, 16.

IMPEDANCE TRANSFORMING BULK ACOUSTIC WAVE BALUNS

BACKGROUND

FIG. 1 shows a block diagram of a balun 10, which is a circuit that performs a signal conversion between a single-ended (unbalanced) port 12 and two differential (balanced) ports 14, 16. In some implementations, the single-ended port 12 is a signal input and the two differential ports 14 16 are signal outputs. In other implementations, the single-ended port 12 is a signal output and the two differential ports 14, 16 are signal inputs. The single-ended or unbalanced port of a balun is a signal port that receives a signal over a cable (e.g., a coaxial cable) that uses a single conductor to transmit the signal, which typically is referenced to the device ground potential. The differential or balanced ports of a balun are signal ports that receive a signal over a cable (e.g., a twisted-pair cable) that has two identical conductors for carrying voltages that are opposite in polarity but equal in magnitude with respect to ground. The balun 10 typically is used to connect components with unbalanced inputs or outputs (e.g., an antenna) to signal lines and components with balanced inputs or outputs (e.g., a differential amplifier), which typically are characterized by superior immunity to electromagnetic interference, power supply noise and ground noise relative to unbalanced components. The balun 10 also typically passively transforms the impedance between the single-ended port 12 and the two differential ports 14, 16.

Baluns commonly are implemented by transformers that have a first winding connected to the single-ended port and a second winding connected to the two differential ports. Recently, baluns have been implemented by bulk acoustic wave (BAW) resonators.

Known BAW resonators include one or more piezoelectric layers disposed between two electrodes. For example, thin film bulk acoustic wave resonators (FBARs) typically include a single piezoelectric layer between two electrodes. Stacked thin film bulk acoustic wave resonators (SBARs), on the other hand, typically include two or more piezoelectric layers disposed between top and bottom electrode layers and separated from each other by one or more intervening electrodes. Some acoustic resonator devices include multiple acoustic resonators that are isolated from one another by respective decouplers, which are formed by one or more dielectric layers that provide only weak acoustic coupling between the acoustic resonators. A BAW resonator has a resonant frequency that is determined by the thickness of the piezoelectric layer and by the thicknesses and the materials used for the other layers. A BAW resonator typically is acoustically isolated from the supporting substrate by an acoustic isolator, which may include a cavity formed under a membrane supporting a BAW resonator or an acoustic mirror that includes of a stack of layers alternately formed of high and low acoustic impedance materials and having respective thicknesses of approximately one-quarter of the wavelength corresponding to the target resonant frequency of the device. A BAW resonator that is disposed on an acoustic mirror often is referred to as a solidly mounted resonator (SMR).

Figure 2:
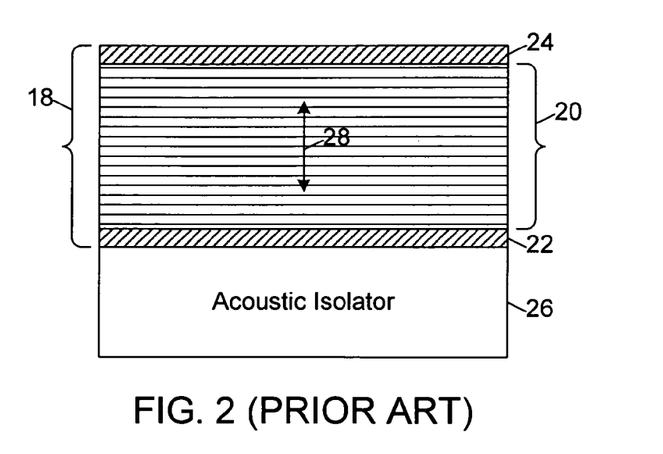
FIG. 2 is a diagrammatic sectional view of a prior art FBAR.

FIG. 2 shows an example of a thin film bulk acoustic wave resonator (FBAR) 18 that includes a single piezoelectric layer 20 between two electrodes 22, 24. The FBAR 18 is acoustically isolated from the underlying substrate by an acoustic isolator 26. In operation, a time-varying electrical signal at the resonant frequency of the FBAR 18 is applied across the electrodes 22, 24. The applied electrical signal induces acoustic vibrations parallel to a propagation axis 28, which is normal to the electrodes 22, 24.

Figure 3:
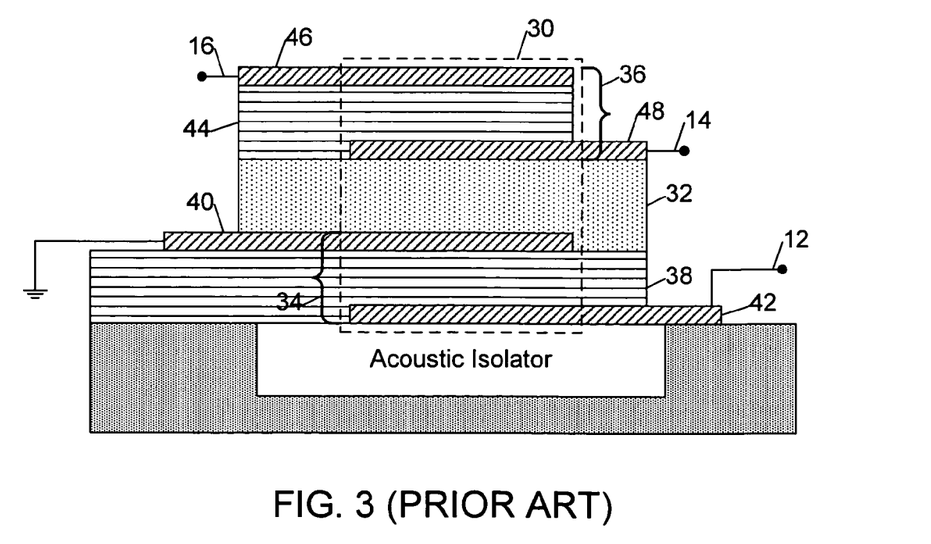
FIG. 3 is a diagrammatic sectional view of a prior art 1:1 impedance transforming balun that is formed from a pair of FBARs.

FIG. 3 shows an example of a prior art balun 30 that is implemented using FBARs. The balun 30 includes a dielectric layer 32 separating a first FBAR 34 and a second FBAR 36. The first FBAR 34 consists of the overlapping regions of a piezoelectric layer 38, a top electrode 40, and a bottom electrode 42. The second FBAR 36 consists of the overlapping regions of a piezoelectric layer 44, a top electrode 46, and a bottom electrode 48. The active area of the balun 30 corresponds to the overlapping regions of the first and second FBARs 34, 36 (shown by the dashed box). In this example, the bottom electrode 42 of the first FBAR 34 is connected to the single-ended port 12, the top electrode 40 of the first FBAR 34 is connected to the device ground, the bottom electrode 48 of the second FBAR 36 is connected to the first differential port 14, and the top electrode 46 of the second FBAR 36 is connected to the second differential port 16. In this design, the material compositions and thicknesses of the constituent layers of the first and second FBARs 34, 36 are the same. Consequently, the balun 30 produces a 1:1 impedance transformation between the single-ended port 12 and the differential ports 14, 16.

Figure 4:
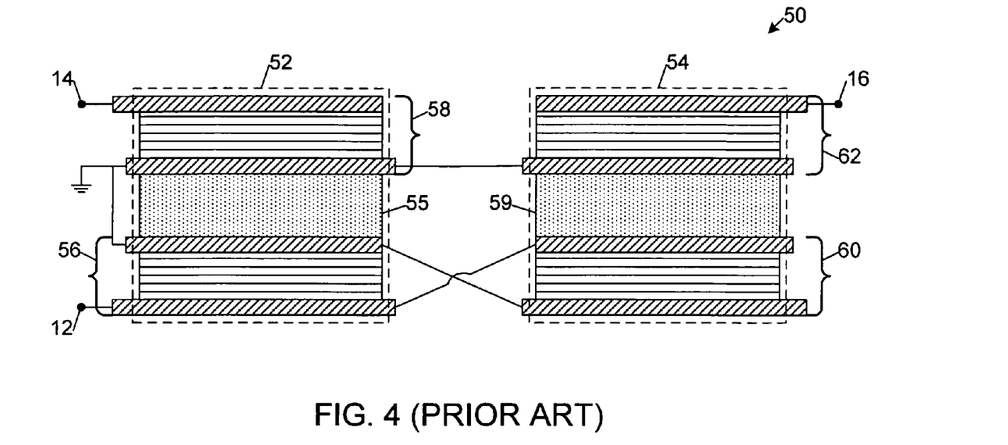
FIG. 4 is a diagrammatic sectional view of a prior art 1:4 impedance transforming balun that is formed from a pair of electrically interconnected SBARs.

FIG. 4 shows another example of a prior art balun 50 that includes a first SBAR 52 and a second SBAR 54. The first SBAR 52 is formed from a dielectric layer 55 between a first FBAR 56 and a second FBAR 58. The second SBAR 54 is formed from a dielectric layer 59 between a third FBAR 60 and a fourth FBAR 62. The bottom electrode of the first FBAR 56 is connected to the single-ended port 12 and to the top electrode of the third FBAR 60. The top electrode of the first FBAR 56, the bottom electrode of the second FBAR 58, the bottom electrode of the third FBAR 60, and the bottom electrode of the fourth FBAR 62 all are connected to the device ground. The top electrode of the second FBAR 58 is connected to the first differential port 14 and the top electrode of the fourth FBAR 62 is connected to the second differential port 16. In this design, the first, second, third, and fourth FBARs 56, 58, 60, 62 are the same. Consequently, the balun 50 produces a 1:4 impedance transformation from the single-ended port 12 to the differential ports 14, 16.

Although baluns that provide 1:1 and 1:4 impedance transformations have a wide variety of useful applications, some applications would benefit from baluns that may be tailored to provide customized impedance transformations that are different from 1:1 and 1:4. What are needed are impedance transforming BAW baluns that are capable of flexibly providing a wide variety of different impedance transformations between the balanced ports and the unbalanced ports without increasing losses within the devices.

SUMMARY

In one aspect, the invention features a bulk acoustic wave (BAW) device that includes a stacked bulk acoustic wave resonator (SBAR) that includes an acoustic decoupler between first and second film bulk acoustic resonators (FBARs). The first FBAR is resonant at the resonant frequency and includes first and second planar electrodes abutting opposite sides of a first resonator volume free of any intervening electrodes and containing piezoelectric material disposed for acoustic vibrations parallel to a propagation axis normal to the first and second electrodes. The first FBAR has a first electrical impedance parallel to the propagation axis. The second FBAR is resonant at the resonant frequency and includes third and fourth planar electrodes abutting opposite sides of a second resonator volume free of any intervening electrodes and containing piezoelectric material disposed for acoustic vibrations parallel to the propagation axis. The second FBAR has a second electrical impedance parallel to the propagation axis and different from the first electrical impedance.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The impedance transforming BAW baluns that are described in detail below are capable of flexibly providing a wide variety of different impedance transformations between the balanced ports and the unbalanced ports without increasing losses within the devices.

Figure 5:
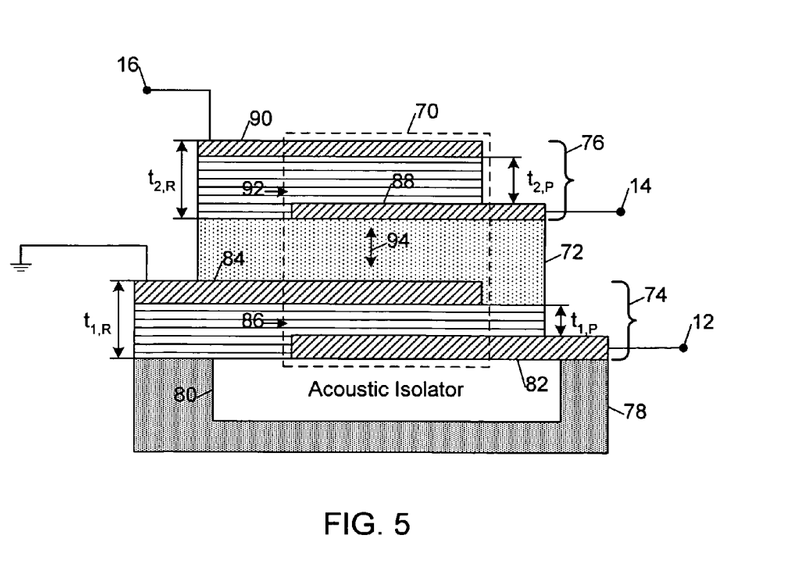
FIG. 5 is a diagrammatic sectional view of a balun that is formed from a pair of FBARs in accordance with an embodiment of the invention.

FIG. 5 shows a first impedance transforming balun 70 in accordance with an embodiment of the invention. The balun 70 includes and SBAR formed from an acoustic decoupler 72 that is disposed between a first FBAR 74 and a second FBAR 76 on a substrate 78. The balun 70 is acoustically isolated from the substrate 78 by an acoustic isolator 80, which may include a cavity formed under a membrane supporting the balun 70 or an acoustic mirror that includes of a stack of layers alternately formed of high and low acoustic impedance materials and having respective thicknesses of approximately one-quarter of the wavelength corresponding to the target resonant frequency of the balun 70. The balun 70 may be used in a wide variety of application areas, including communication lines, devices, and circuits (e.g., frequency conversion mixers, radars, transmitters, satellites, telephony network devices and circuits, and wireless network modems and routers).

The acoustic decoupler 72 electrically isolates the first FBAR 74 from the second FBAR 76 and provides only weak acoustic coupling between the first FBAR 74 and the second FBAR 76. In some implementations, the acoustic decoupler 72 is formed of a single layer of dielectric material (e.g., a SiLK dielectric polymer, available from The Dow Chemical Company of Midland, Mich., U.S.A.). In other implementations, the acoustic decoupler 72 is formed of a stack of layers alternately formed of high and low acoustic impedance materials and having respective thicknesses of approximately one-quarter of the wavelength corresponding to the target resonant frequency of the balun 70.

The first FBAR 74 is defined by the overlapping regions of a first planar electrode 82 and a second planar electrode 84 that abut opposite sides of a first resonator volume 86. The second FBAR 76 is defined by the overlapping regions of a third planar electrode 88 and a fourth planar electrode 90 that abut opposite sides of a second resonator volume 92.

The first, second, third, and fourth electrodes 82, 84, 88, 90 typically are formed of one or more layers of Mo, Al, Au, Pt, Ti, and alloys thereof. Each of the first and second resonator volumes 86, 92 is free of any intervening electrodes and contains piezoelectric material disposed for acoustic vibrations parallel to a propagation axis 94 that is normal to the planar electrodes 82, 84, 88, 90. The piezoelectric material in each of the first and second resonator volumes 86, 92 typically is in the form of one or more layers of piezoelectric material, such as a wurtzite-type hexagonal crystal (e.g., cadmium sulfide, cadmium selenide, zinc oxide, beryllium oxide, aluminum nitride, and wurtzite zinc sulfide, and solid solutions thereof) and lead-zirconate-titanate (PZT).

The active area of the balun 70 corresponds to the overlapping regions of the first and second FBARs 74, 76 (shown by the dashed box). The first electrode 82 of the first FBAR 74 is connected to the single-ended port 12, the second electrode 84 of the first FBAR 74 is connected to the device ground, the third electrode 88 of the second FBAR 76 is connected to the first differential port 14, and the fourth electrode 90 of the second FBAR 76 is connected to the second differential port 16. As used herein, the term "device ground" refers to a common return path in a device that is the zero voltage reference level for the device.

In this embodiment, the first FBAR 74 has a first electrical impedance parallel to the propagation axis 94 and the second FBAR 76 has a second electrical impedance parallel to the propagation axis 94 that is different from the first electrical impedance. As used herein, the term "electric impedance" refers to a measure of the impediment to the flow of alternating current caused by a combination of resistance and reactance and typically is measured in ohms at a given frequency. The different electrical impedances of the first and second FBARs 74, 76 are set to achieve a wide variety of different impedance transformations between the unbalanced port 12 and the unbalanced ports 14, 16. In general, the impedance transformation is given by $Z_1:Z_2$, where $Z_1$ is the electrical impedance of the first FBAR 74 and $Z_2$ is the electrical impedance of the second FBAR 76.

In some embodiments, the different electrical impedances of the first and second FBARs are set by forming one or more of the corresponding constituent layers of the first and second FBARs 74, 76 with different material compositions.

In the illustrated embodiment, the material compositions of the electrodes 82, 84, 88, 90 are substantially the same and the compositions of the piezoelectric materials in the first and second resonator volumes 86, 92 are substantially the same. The different electrical impedances of the first and second FBARs 74, 76 are set by forming the first and second resonator volumes 86, 92 with different thicknesses $t_{1,P}$, $t_{2,P}$. For example, in the exemplary embodiment shown in FIG. 5, the thickness $t_{1,P}$ of the first resonator volume 86 is smaller than the thickness $t_{2,P}$ of the second resonator volume 92. In this way, the electrical impedance of the second FBAR 76, which is proportional to the thickness of the piezoelectric material in the second resonator volume 92, is larger than the electrical impedance of the first FBAR 74, which is proportional to the thickness of the piezoelectric material in the first resonator volume 86. In order to maintain the same resonant frequencies in the first and second FBARs 74, 76, the overall acoustic thicknesses $t_{1,R}$, $t_{2,R}$ of the first and second FBARs 74, 76 are made substantially equal to one-half of the wavelength corresponding to the resonant frequency of the balun 70. In the illustrated embodiment, this is achieved by making the acoustic thicknesses of the first and second electrodes 82, 84 larger than the acoustic thickness of the third and fourth electrodes 88, 90 by an amount that compensates for the smaller acoustic thickness of the first resonator volume 86 relative to the acoustic thickness of the second resonator volume 92.

In the illustrated embodiment, the overlapping areas of the first and second FBARs 74, 76 normal to the propagation axis 94 are substantially equal. In this way, acoustic signals may be transmitted efficiently between the first and second FBARs 74, 76 without increased loss of acoustic energy within the balun 70.

Figure 6:
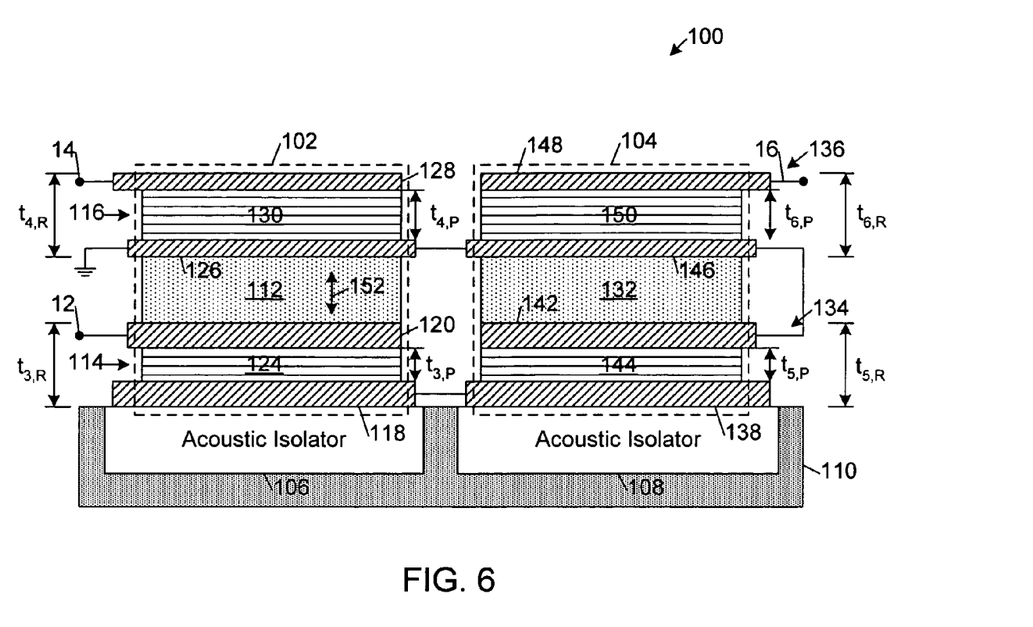
FIG. 6 is a diagrammatic sectional view of a balun that is formed from a pair of electrically interconnected SBARs in accordance with an embodiment of the invention.

FIG. 6 shows a second impedance transforming balun 100 in accordance with an embodiment of the invention. The balun 100 includes first and second SBARs 102, 104 formed over respective acoustic isolators 106, 108 in a substrate 110. The acoustic isolators 106, 108 may include a cavity formed under a membrane supporting the balun 100 or an acoustic mirror that includes of a stack of layers alternately formed of high and low acoustic impedance materials and having respective thicknesses of approximately one-quarter of the wavelength corresponding to the target resonant frequency of the balun 100. The balun 100 may be used in a wide variety of application areas, including communication lines, devices, and circuits (e.g., frequency conversion mixers, radars, transmitters, satellites, telephony network devices and circuits, and wireless network modems and routers).

The first SBAR 102 is formed from an acoustic decoupler 112 that is disposed between a first FBAR 114 and a second FBAR 116. The acoustic decoupler 112 is formed the same way as the decoupler 72, which is described above and shown in FIG. 5. The first FBAR 114 is defined by the overlapping regions of a first planar electrode 118 and a second planar electrode 120 that abut opposite sides of a first resonator volume 124. The second FBAR 116 is defined by the overlapping regions of a third planar electrode 126 and a fourth planar electrode 128 that abut opposite sides of a second resonator volume 130.

The second SBAR 104 is formed from an acoustic decoupler 132 that is disposed between a third FBAR 134 and a fourth FBAR 136. The acoustic decoupler 132 is formed the same way as the decoupler 72, which is described above and shown in FIG. 5. The third FBAR 134 is defined by the overlapping regions of a fifth planar electrode 138 and a sixth planar electrode 142 that abut opposite sides of a third resonator volume 144. The fourth FBAR 136 is defined by the overlapping regions of a seventh planar electrode 146 and an eighth planar electrode 148 that abut opposite sides of a fourth resonator volume 150.

The electrodes of the first, second, third, and fourth FBARs 114, 116, 134, 136 typically are formed of one or more layers of Mo, Al, Au, Pt, Ti, and alloys thereof. Each of the first, second, third, and fourth resonator volumes 124, 130, 144, 150 is free of any intervening electrodes and contains piezoelectric material disposed for acoustic vibrations parallel to a propagation axis 152 that is normal to the planar electrodes 118, 120, 126, 128, 138, 142, 146, 148. The piezoelectric material in each of the first, second, third, and fourth resonator volumes 124, 130, 144, 150 typically is in the form of one or more layers of piezoelectric material, such as a wurtzite-type hexagonal crystal (e.g., cadmium sulfide, cadmium selenide, zinc oxide, beryllium oxide, aluminum nitride, and wurtzite zinc sulfide, and solid solutions thereof) and lead-zirconate-titanate (PZT).

The active area of the first SBAR 102 corresponds to the overlapping regions of the first and second FBARs 114, 116 (shown by the left dashed box) and the active area of the second SBAR 104 corresponds to the overlapping regions of the third and fourth FBARs 134, 136 (shown by the right dashed box). The second electrode 120 of the first FBAR 114 is connected to the single-ended port 12. The first electrode 118 of the first FBAR 114 is connected to the fifth electrode 138 of the third FBAR 134. The third electrode 126 of the second FBAR 116, the seventh electrode 146 of the fourth FBAR 136, and the sixth electrode 142 of the third FBAR 134 are connected to the device ground. The fourth electrode 128 of the second FBAR 116 is connected to the first differential port 14, and the eighth electrode 148 of the fourth FBAR 136 is connected to the second differential port 16.

In this embodiment, the first, second, third, and fourth FBARs 114, 116, 134, 136 respectively have first, second, third, and fourth electrical impedances $Z_1$, $Z_2$, $Z_3$, $Z_4$ parallel to the propagation axis 152. In general, at least one of the first, second, third, and fourth electrical impedances is different from the others. The differences in the electrical impedances of the first, second, third and fourth FBARs 114, 116, 134, 136 are set to achieve a wide variety of different impedance transformations between the unbalanced port 12 and the unbalanced ports 14, 16.

In the illustrated embodiment, the first and third electrical impedances (i.e., the electrical impedances of the first and third FBARs 114, 134) are substantially equal ($Z_1=Z_3=Z_{13}$), the second and fourth electrical impedances (i.e., the electrical impedances of the second and fourth FBARs 116, 136) are substantially equal ($Z_2=Z_4=Z_{24}$), and the first and third electrical impedances are different from the second and fourth electrical impedances (i.e., $Z_{13} \neq Z_{24}$). In general, the impedance transformation is given by $Z_{13}:Z_{24}$, where $Z_{13}$ is the electrical impedance of the first and third FBARs 114, 134 and $Z_{24}$ is the electrical impedance of the second and fourth FBARs 116, 136.

In some embodiments, the different electrical impedances of the FBARs 114, 116, 134, 136 are set by forming one or more of the corresponding constituent layers of the FBARs 114, 116, 134, 136 with different material compositions.

In the illustrated embodiment, the material compositions of the electrodes of the FBARs 114, 116, 134, 136 are substantially the same and the compositions of the piezoelectric material in the resonator volumes of the FBARs 114, 116, 134, 136 are substantially the same. The different electrical impedances of the FBARs 114, 116, 134, 136 are set by forming the first and third resonator volumes 124, 144 with thicknesses $t_{3,P}$, $t_{5,P}$ that are different than the thicknesses $t_{4,P}$, $t_{6,P}$ of the second and fourth resonator volumes 130, 150. For example, in the exemplary embodiment shown in FIG. 6, the thickness $t_{3,P}=t_{5,P}$ of the first and third resonator volumes 124, 144 is smaller than the thickness $t_{4,P}=t_{6,P}$ of the second and fourth resonator volumes 130, 150. In this way, the electrical impedance of the second and fourth FBARs 116, 136, which is proportional to the thickness of the piezoelectric material in the second and fourth resonator volumes 130, 150, is larger than the electrical impedance of the first and third FBARs 114, 134, which is proportional to the thickness of the piezoelectric material in the first and third resonator volumes 116, 136. In order to maintain the same resonant frequencies in the first, second, third and fourth FBARs 114, 116, 134, 136, the overall acoustic thicknesses $t_{3,R}$, $t_{4,R}$, $t_{5,R}$, $t_{6,R}$ of the first, second, third and fourth FBARs 114, 116, 134, 136 are made substantially equal to one-half of the wavelength corresponding to the resonant frequency of the balun 100. In the illustrated embodiment, this is achieved by making the acoustic thicknesses of the first, second, fifth, and sixth electrodes 118, 120, 138, 142 larger than the acoustic thicknesses of the third, fourth, seventh, and eighth electrodes 126, 128, 146, 148 by amount that compensates for the smaller acoustic thicknesses of the first and third resonator volumes 124, 144 relative to the acoustic thicknesses of the second and fourth resonator volumes 130, 150.

In the illustrated embodiment, the overlapping areas of the first and second FBARs 114, 116 normal to the propagation axis 152 are substantially equal and the overlapping areas of the third and fourth FBARs 134, 136 normal to the propagation axis 152 are substantially equal. In this way, acoustic signals may be transmitted efficiently between the first and second FBARs 114, 116 and between the third and fourth FBARs 134, 136 without increased loss of acoustic energy within the balun 100. In the illustrated embodiment, the overlapping areas of the first and second FBARs 114, 116 also are substantially equal to the overlapping areas of the third and fourth FBARs 134, 136 in order to maintain the symmetry between the first and second differential ports 14, 16.

Figure 7:
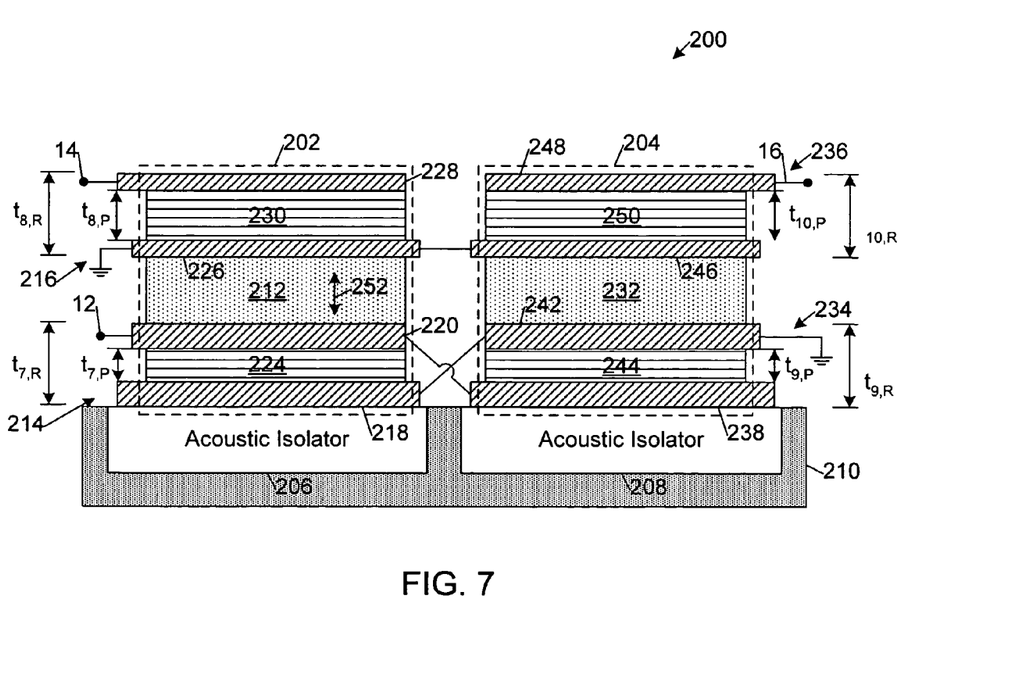
FIG. 7 is a diagrammatic sectional view of a balun that is formed from a pair of electrically interconnected SBARs in accordance with an embodiment of the invention.

FIG. 7 shows a second impedance transforming balun 200 in accordance with an embodiment of the invention. The balun 200 includes first and second SBARs 202, 204 formed over respective acoustic isolators 206, 208 in a substrate 210. The acoustic isolators 206, 208 may include a cavity formed under a membrane supporting the balun 200 or an acoustic mirror that includes of a stack of layers alternately formed of high and low acoustic impedance materials and having respective thicknesses of approximately one-quarter of the wavelength corresponding to the target resonant frequency of the balun 200. The balun 200 may be used in a wide variety of application areas, including communication lines, devices, and circuits (e.g., frequency conversion mixers, radars, transmitters, satellites, telephony network devices and circuits, and wireless network modems and routers).

The first SBAR 202 is formed from an acoustic decoupler 212 that is disposed between a first FBAR 214 and a second FBAR 216. The acoustic decoupler 212 is formed the same way as the decoupler 72, which is described above and shown in FIG. 5. The first FBAR 214 is defined by the overlapping regions of a first planar electrode 218 and a second planar electrode 220 that abut opposite sides of a first resonator volume 224. The second FBAR 216 is defined by the overlapping regions of a third planar electrode 226 and a fourth planar electrode 228 that abut opposite sides of a second resonator volume 230.

The second SBAR 204 is formed from an acoustic decoupler 232 that is disposed between a third FBAR 234 and a fourth FBAR 236. The acoustic decoupler 232 is formed the same way as the decoupler 72, which is described above and shown in FIG. 5. The third FBAR 234 is defined by the overlapping regions of a fifth planar electrode 238 and a sixth planar electrode 242 that abut opposite sides of a third resonator volume 244. The fourth FBAR 236 is defined by the overlapping regions of a seventh planar electrode 246 and an eighth planar electrode 248 that abut opposite sides of a fourth resonator volume 250.

The electrodes of the first, second, third, and fourth FBARs 214, 216, 234, 236 typically are formed of one or more layers of Mo, Al, Au, Pt, Ti, and alloys thereof. Each of the first, second, third, and fourth resonator volumes 224, 230, 244, 250 is free of any intervening electrodes and contains piezoelectric material disposed for acoustic vibrations parallel to a propagation axis 252 that is normal to the planar electrodes 218, 220, 226, 228, 238, 242, 246, 248. The piezoelectric material in each of the first, second, third, and fourth resonator volumes 224, 230, 244, 250 typically is in the form of one or more layers of piezoelectric material, such as a wurtzite-type hexagonal crystal (e.g., cadmium sulfide, cadmium selenide, zinc oxide, beryllium oxide, aluminum nitride, and wurtzite zinc sulfide, and solid solutions thereof) and lead-zirconate-titanate (PZT).

The active area of the first SBAR 202 corresponds to the overlapping regions of the first and second FBARs 214, 216 (shown by the left dashed box) and the active area of the second SBAR 204 corresponds to the overlapping regions of the third and fourth FBARs 234, 236 (shown by the right dashed box). The second electrode 220 of the first FBAR 214 and the fifth electrode 238 of the third FBAR 234 are connected to the single-ended port 12. The first electrode 218 of the first FBAR 24, the third electrode 226 of the second FBAR 216, the seventh electrode 246 of the fourth FBAR 236, and the sixth electrode 242 of the third FBAR 234 are connected to the device ground. The fourth electrode 228 of the second FBAR 216 is connected to the first differential port 14, and the eighth electrode 248 of the fourth FBAR 236 is connected to the second differential port 16.

In this embodiment, the first, second, third, and fourth FBARs 214, 216, 234, 236 respectively have first, second, third, and fourth electrical impedances $Z'_1$, $Z'_2$, $Z'_3$, $Z'_4$ parallel to the propagation axis 252. In general, at least one of the first, second, third, and fourth electrical impedances is different from the others. The differences in the electrical impedances of the first, second, third and fourth FBARs 214, 216, 234, 236 are set to achieve a wide variety of different impedance transformations between the unbalanced port 12 and the unbalanced ports 14, 16.

In the illustrated embodiment, the first and third electrical impedances (i.e., the electrical impedances of the first and third FBARs 214, 234) are substantially equal ($Z'_1=Z'_3=Z'_{13}$), the second and fourth electrical impedances (i.e., the electrical impedances of the second and fourth FBARs 216, 236) are substantially equal ($Z'_2=Z'_4=Z'_{24}$), and the first and third electrical impedances are different from the second and fourth electrical impedances (i.e., $Z'_{13} \neq Z'_{24}$). In general, the impedance transformation is given by $$4 \cdot \frac{Z'_{24}}{Z'_{13}} : 1 \qquad (1)$$

where $Z'_{13}$ is the electrical impedance of the first and third FBARs 214, 234 and $Z'_{24}$ is the electrical impedance of the second and fourth FBARs 216, 236.

In some embodiments, the different electrical impedances of the FBARs 214, 216, 234, 236 are set by forming one or more of the corresponding constituent layers of the FBARs 214, 216, 234, 236 with different material compositions.

In the illustrated embodiment, the material compositions of the electrodes of the FBARs 214, 216, 234, 236 are substantially the same and the compositions of the piezoelectric material in the resonator volumes of the FBARs 214, 216, 234, 236 are substantially the same. The different electrical impedances of the FBARs 214, 216, 234, 236 are set by forming the first and third resonator volumes 224, 244 with thicknesses $t_{7,P}$, $t_{9,P}$ that are different than the thicknesses $t_{8,P}$, $t_{10,P}$ of the second and fourth resonator volumes 230, 250. For example, in the exemplary embodiment shown in FIG. 7 the thickness $t_{7,P}=t_{9,P}$ of the first and third resonator volumes 224, 244 is smaller than the thickness $t_{8,P}=t_{10,P}$ of the second and fourth resonator volumes 230, 250. In this way, the electrical impedance of the second and fourth FBARs 216, 236, which is proportional to the thickness of the piezoelectric material in the second and fourth resonator volumes 230, 250, is larger than the electrical impedance of the first and third FBARs 214, 234, which is proportional to the thickness of the piezoelectric material in the first and third resonator volumes 216, 236. In order to maintain the same resonant frequencies in the first, second, third and fourth FBARs 214, 216, 234, 236, the overall acoustic thicknesses $t_{7,R}$, $t_{8,R}$, $t_{9,R}$, $t_{10,R}$ of the first, second, third and fourth FBARs 214, 216, 234, 236 are made substantially equal to one-half of the wavelength corresponding to the resonant frequency of the balun 200. In the illustrated embodiment, this is achieved by making the acoustic thicknesses of the first, second, fifth, and sixth electrodes 218, 220, 238, 242 larger than the acoustic thicknesses of the third, fourth, seventh, and eighth electrodes 226, 228, 246, 248 by amount that compensates for the smaller acoustic thickness of the first and third resonator volumes 224, 244 relative to the acoustic thicknesses of the third and fourth resonator volumes 230, 250.

In the illustrated embodiment, the overlapping areas of the first and second FBARs 214, 216 normal to the propagation axis 252 are substantially equal and the overlapping areas of the third and fourth FBARs 234, 236 normal to the propagation axis 252 are substantially equal. In this way, acoustic signals may be transmitted efficiently between the first and second FBARs 214, 216 and between the third and fourth FBARs 234, 236 without increased loss of acoustic energy within the balun 200. In the illustrated embodiment, the overlapping areas of the first and second FBARs 214, 216 also are substantially equal to the overlapping areas of the third and fourth FBARs 234, 236 in order to maintain the symmetry between the first and second differential ports 14, 16.

Figure 8:
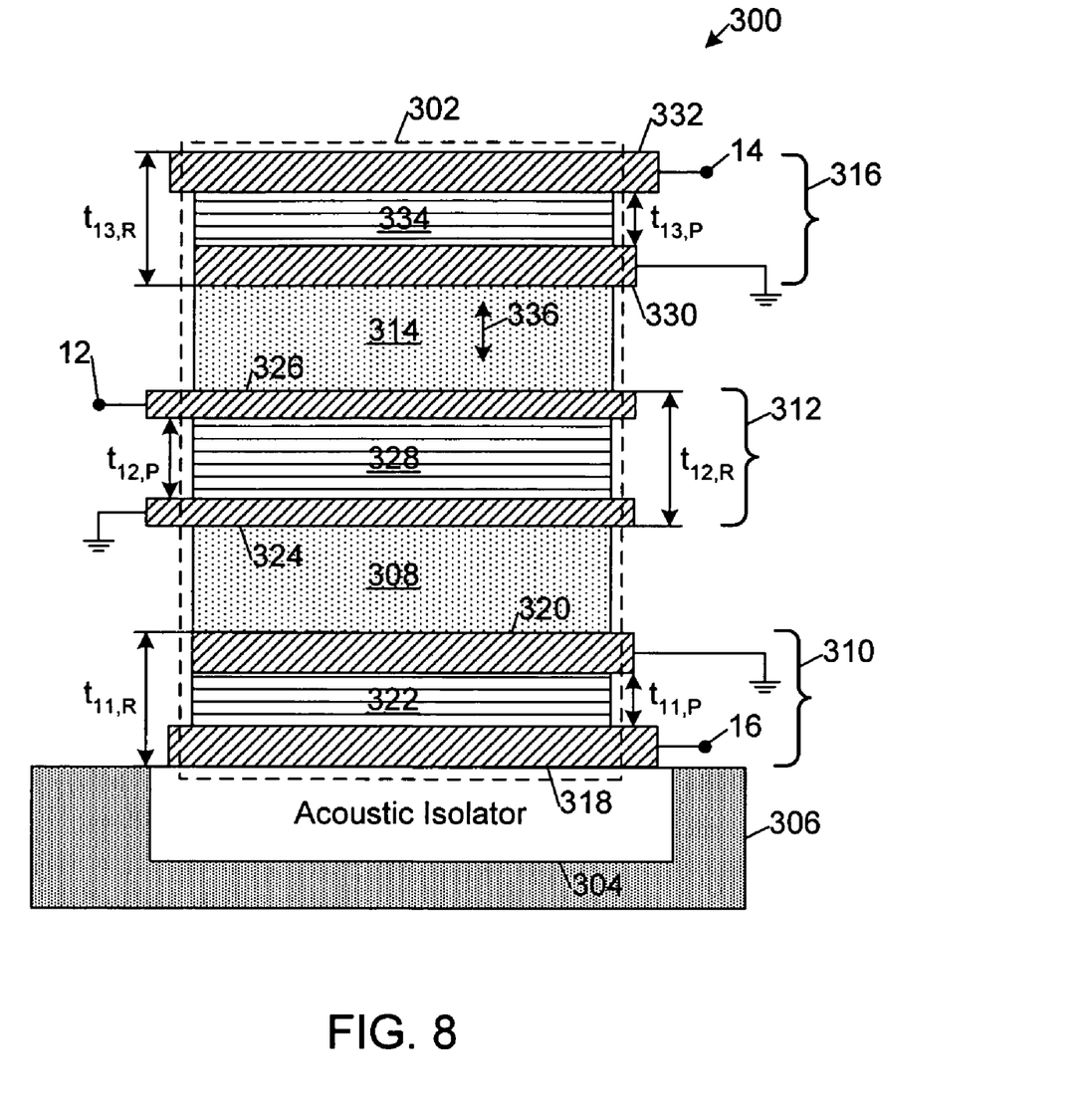
FIG. 8 is a diagrammatic sectional view of a balun that is formed from a stack of three FBARs in accordance with an embodiment of the invention.

FIG. 8 shows a third impedance transforming balun 300 in accordance with an embodiment of the invention. The balun 300 includes an SBAR 302 formed over respective acoustic isolator 304 in a substrate 306. The acoustic isolator 304 may include a cavity formed under a membrane supporting the balun 300 or an acoustic mirror that includes of a stack of layers alternately formed of high and low acoustic impedance materials and having respective thicknesses of approximately one-quarter of the wavelength corresponding to the target resonant frequency of the balun 300. The balun 300 may be used in a wide variety of application areas, including communication lines, devices, and circuits (e.g., frequency conversion mixers, radars, transmitters, satellites, telephony network devices and circuits, and wireless network modems and routers).

The SBAR 302 is formed from a first acoustic decoupler 308 that is disposed between a first FBAR 310 and a second FBAR 312 and a second acoustic decoupler 314 that is disposed between the second FBAR 312 and a third FBAR 316. The acoustic decouplers 308, 314 are formed the same way as the decoupler 72, which is described above and shown in FIG. 5. The first FBAR 310 is defined by the overlapping regions of a first planar electrode 318 and a second planar electrode 320 that abut opposite sides of a first resonator volume 322. The second FBAR 312 is defined by the overlapping regions of a third planar electrode 324 and a fourth planar electrode 326 that abut opposite sides of a second resonator volume 328. The third FBAR 316 is defined by the overlapping regions of a fifth planar electrode 330 and a sixth planar electrode 332 that abut opposite sides of a second resonator volume 334.

The electrodes of the first, second, and third FBARs 310, 312, 316 typically are formed of one or more layers of Mo, Al, Au, Pt, Ti, and alloys thereof. Each of the first, second, and third resonator volumes 322, 328, 334 is free of any intervening electrodes and contains piezoelectric material disposed for acoustic vibrations parallel to a propagation axis 336 that is normal to the planar electrodes 318, 320, 324, 326, 330, 332. The piezoelectric material in each of the first, second, and third resonator volumes 322, 328, 334 typically is in the form of one or more layers of piezoelectric material, such as a wurtzite-type hexagonal crystal (e.g., cadmium sulfide, cadmium selenide, zinc oxide, beryllium oxide, aluminum nitride, and wurtzite zinc sulfide, and solid solutions thereof) and lead-zirconate-titanate (PZT).

The active area of the SBAR 302 corresponds to the overlapping regions of the first, second, and third FBARs 310, 312, 316 (shown by the dashed box). The fourth electrode 326 of the second FBAR 312 is connected to the single-ended port 12. The second electrode 320 of the first FBAR 310, the third electrode 324 of the second FBAR 312, and the fifth electrode 330 of the third FBAR 316 are connected to the device ground. The first electrode 318 of the first FBAR 310 is connected to the second differential port 16, and the sixth electrode 332 of the third FBAR 316 is connected to the first differential port 14.

In this embodiment, the first, second, and third FBARs 310, 312, 316 respectively have first, second, and third electrical impedances $Z''_1$, $Z''_2$, $Z''_3$ parallel to the propagation axis 336. In general, at least one of the first, second, and third electrical impedances is different from the others. The differences in the electrical impedances of the first, second, and third FBARs 310, 312, 316 are set to achieve a wide variety of different impedance transformations between the unbalanced port 12 and the unbalanced ports 14, 16.

In the illustrated embodiment, the first and third electrical impedances (i.e., the electrical impedances of the first and third FBARs 310, 316) are substantially equal $(Z''_1=Z''_3=Z''_{13})$ and different from the second electrical impedance (i.e., the electrical impedance of the second FBAR 312, referred to by $Z''_2$). In general, the impedance transformation is given by $2\times Z''_{13}:Z''_2$, where $Z''_{13}$ is the electrical impedance of the first and third FBARs 310, 316 and $Z''_2$ is the electrical impedance of the second FBAR 312.

In some embodiments, the different electrical impedances of the FBARs 310, 312, 316 are set by forming one or more of the corresponding constituent layers of the FBARs 310, 312, 316 with different material compositions.

In the illustrated embodiment, the material compositions of the electrodes of the FBARs 310, 312, 316 are substantially the same and the compositions of the piezoelectric material in the resonator volumes of the FBARs 310, 312, 316 are substantially the same. The different electrical impedances of the FBARs 310, 312, 316 are set by forming the first and third resonator volumes 322, 334 with thicknesses $t_{11,P}$, $t_{13,P}$ that are different than the thickness $t_{12,P}$ of the second resonator volume 328. For example, in the exemplary embodiment shown in FIG. 8 the thickness $t_{11,P}=t_{13,P}$ of the first and third resonator volumes 322, 334 is smaller than the thickness $t_{12,P}$ of the second resonator volume 312. In this way, the electrical impedance of the second FBAR 312, which is proportional to the thickness of the piezoelectric material in the second resonator volume 328, is larger than the electrical impedance of the first and third FBARs 310, 316, which is proportional to the thickness of the piezoelectric material in the first and third resonator volumes 322, 334. In order to maintain the same resonant frequencies in the first, second, and third FBARs 310, 312, 316, the overall acoustic thicknesses $t_{11,R}$, $t_{12,R}$, $t_{13,R}$ of the first, second, and third FBARs 310, 312, 316 are made substantially equal to one-half of the wavelength corresponding to the resonant frequency of the balun 300. In the illustrated embodiment, this is achieved by making the acoustic thicknesses of the first, second, fifth, and sixth electrodes 318, 320, 330, 332 larger than the acoustic thicknesses of the third and fourth electrodes 324, 326 by an amount that compensates for the smaller acoustic thicknesses of the first and third resonator volumes 322, 334 relative to the acoustic thickness of the second resonator volume 328.

In the illustrated embodiment, the overlapping areas of the first, second, and third FBARs 310, 312, 316 normal to the propagation axis 336 are substantially equal. In this way, acoustic signals may be transmitted efficiently between the second FBAR 312 and the first and third FBARs 310, 316 without increased loss of acoustic energy within the balun 300. This feature also maintains the symmetry between the first and second differential ports 14, 16.

Any of the above-described impedance transforming balun embodiments in accordance with the invention may by supplemented by one or more reactive elements (i.e., inductances and capacitances) that are electrically coupled to one or more of the single-ended port 12 and the differential ports 14, 16 in order to improved the performance of these devices.

Other embodiments are within the scope of the claims.

For example, the embodiments in accordance with the invention described above and shown in the drawings provide an impedance transformation between a single-ended port and two differential ports. Other embodiments in accordance with the invention provide an impedance transformation between two single-ended ports.

What is claimed is:

1. A bulk acoustic wave (BAW) device comprising:
    a stacked bulk acoustic wave resonator (SBAR) comprising an acoustic decoupler between first and second film bulk acoustic resonators (FBARs),
    the first FBAR being resonant at a resonant frequency and comprising first and second planar electrodes abutting opposite sides of a first resonator volume free of intervening electrodes and containing piezoelectric material disposed for acoustic vibrations parallel to a propagation axis normal to the first and second electrodes, the first FBAR having a first electrical impedance parallel to the propagation axis,
    the second FBAR being resonant at the resonant frequency and comprising third and fourth planar electrodes abutting opposite sides of a second resonator volume free of intervening electrodes and containing piezoelectric material disposed for acoustic vibrations parallel to the propagation axis, the second FBAR having a second electrical impedance parallel to the propagation axis and different from the first electrical impedance,
    wherein the first resonator volume has a first thickness dimension between the first and second planar electrodes parallel to the propagation axis and the second resonator volume has a second thickness dimension between the third and fourth planar electrodes parallel to the propagation axis, the second thickness dimension being different from the first thickness dimension, and
    wherein each of the first and second planar electrodes has a thickness parallel to the propagation axis that is different from a thickness of each of the third and fourth planar electrodes parallel to the propagation axis, compensating for the difference between the first and second thickness dimensions, such that the first and second FBARs have substantially the same overall acoustic thickness.

2. The BAW device of claim 1, wherein the overall acoustic thickness of the first FBAR and the second FBAR is substantially equal to one-half of a wavelength corresponding to the resonant frequency.

3. The BAW device of claim 1, wherein the first resonator volume is characterized by a first normal dimension that is normal to the propagation axis and the second resonator volume is characterized by a second normal dimension that is normal to the propagation axis and is substantially equal to the first normal dimension.

4. The BAW device of claim 1, further comprising a single-ended signal port, a first differential signal port, a second differential signal port, and a device ground, wherein the first electrode is electrically coupled to the device ground, the second electrode is electrically coupled to the single-ended signal port, the third electrode is electrically coupled to the first differential signal port, and the fourth electrode is electrically coupled to the second differential signal port.

5. The BAW device of claim 1, further comprising a second SBAR electrically coupled to the first SBAR and comprising a second acoustic decoupler between third and fourth FBARs, wherein
    the third FBAR is resonant at the resonant frequency and comprises fifth and sixth planar electrodes abutting opposite sides of a third resonator volume free of intervening electrodes and containing piezoelectric material disposed for acoustic vibrations parallel to the propagation axis, the third FBAR having a third electrical impedance parallel to the propagation axis, and
    the fourth FBAR is resonant at the resonant frequency and comprises seventh and eighth planar electrodes abutting opposite sides of a fourth resonator volume free of intervening electrodes and containing piezoelectric material disposed for acoustic vibrations parallel to the propagation axis, the fourth FBAR having a fourth electrical impedance parallel to the propagation axis and different from the third electrical impedance.

6. The BAW device of claim 5, wherein the first electrical impedance and the third electrical impedance are substantially equal and the second electrical impedance and the fourth electrical impedance are substantially equal.

7. The BAW device of claim 5, wherein the third resonator volume has a third thickness dimension parallel to the propagation axis and the fourth resonator volume has a fourth thickness dimension parallel to the propagation axis and different from the third thickness dimension.

8. The BAW device of claim 7, wherein the first and third thickness dimensions are substantially equal and the second and fourth thickness dimensions are substantially equal.

9. The BAW device of claim 8, wherein the third resonator volume is characterized by a third normal dimension that is normal to the propagation axis, the fourth resonator volume is characterized by a fourth normal dimension that is normal to the propagation axis, and the third and fourth normal dimension are substantially equal to the first normal dimension.

10. The BAW device of claim 5, further comprising a single-ended signal port, a first differential signal port, a second differential signal port, and a device ground, wherein the first electrode is electrically coupled to the device ground, the second electrode and the fifth electrode are electrically coupled to the single-ended signal port, the fourth electrode is electrically coupled to the first differential signal port, and the eighth electrode is electrically coupled to the second differential signal port.

11. The BAW device of claim 5, wherein the first SBAR and the second SBAR correspond to different respective material stacks on a common substrate.

12. The BAW device of claim 1, wherein the SBAR additionally comprises a second decoupler between the second FBAR and a third FBAR, wherein the third FBAR is resonant at the resonant frequency and comprises fifth and sixth planar electrodes abutting opposite sides of a third resonator volume free of intervening electrodes and containing piezoelectric material disposed for acoustic vibrations parallel to the propagation axis.

13. The BAW device of claim 12, wherein the third FBAR has a third electrical impedance parallel to the propagation axis that is substantially equal to the first electrical impedance and different from the second electrical impedance.

14. The BAW device of claim 12, wherein the first resonator volume has a first thickness dimension parallel to the propagation axis, the second resonator volume has a second thickness dimension parallel to the propagation axis and different from the first thickness dimension, the third resonator volume has a third thickness dimension parallel to the propagation axis that is substantially equal to the first thickness dimension.

15. The BAW device of claim 14, wherein the first, second, and third resonator volumes are respectively characterized by first, second, and third normal dimensions that are normal to the propagation axis and are substantially equal to each other.

16. The BAW device of claim 12, further comprising:
a single-ended signal port, a first differential signal port, a second differential signal port, and a device ground, wherein the first electrode is electrically coupled to the first differential signal port, the third electrode is electrically coupled to the device ground, the fourth electrode is electrically coupled to the single-ended signal port, and the sixth electrode is electrically coupled to the second differential signal port.

17. The BAW device of claim 16, wherein the second electrode and the fifth electrode are electrically coupled to the device ground.

18. A bulk acoustic wave (BAW) device, comprising:
a first stacked bulk acoustic wave resonator (SBAR) comprising a first acoustic decoupler between first and second film bulk acoustic resonators (FBARs),
  the first FBAR being resonant at a resonant frequency and comprising first and second planar electrodes abutting opposite sides of a first resonator volume free of intervening electrodes and containing piezoelectric material disposed for acoustic vibrations parallel to a propagation axis normal to the first and second electrodes, the first FBAR having a first electrical impedance parallel to the propagation axis, and
  the second FBAR being resonant at the resonant frequency and comprising third and fourth planar electrodes abutting opposite sides of a second resonator volume free of intervening electrodes and containing piezoelectric material disposed for acoustic vibrations parallel to the propagation axis, the second FBAR having a second electrical impedance parallel to the propagation axis and different from the first electrical impedance; and
a second SBAR electrically coupled to the first SBAR and comprising a second acoustic decoupler between third and fourth FBARs,
  the third FBAR being resonant at the resonant frequency and comprising fifth and sixth planar electrodes abutting opposite sides of a third resonator volume free of intervening electrodes and containing piezoelectric material disposed for acoustic vibrations parallel to the propagation axis, the third FBAR having a third electrical impedance parallel to the propagation axis, and
  the fourth FBAR being resonant at the resonant frequency and comprising seventh and eighth planar electrodes abutting opposite sides of a fourth resonator volume free of intervening electrodes and containing piezoelectric material disposed for acoustic vibrations parallel to the propagation axis, the fourth FBAR having a fourth electrical impedance parallel to the propagation axis and different from the third electrical impedance,
wherein the first resonator volume has a first thickness dimension between the first and second planar electrodes parallel to the propagation axis and the second resonator volume has a second thickness dimension between the third and fourth planar electrodes parallel to the propagation axis, the second thickness dimension being different from the first thickness dimension, and
wherein the first electrode is electrically coupled to the fifth electrode, the second electrode is electrically coupled to a single-ended signal port, the fourth electrode is electrically coupled to a first differential signal port, the eighth electrode is electrically coupled to a second differential signal port, and the third, sixth and seventh electrodes are electrically coupled to a device ground.

19. An impedance transforming balun, comprising:
a first film bulk acoustic resonator (FBAR) resonant at a resonant frequency and having a first electrical impedance, the first FBAR comprising a first planar electrode, a second planar electrode, and a first resonator volume between the first and second planar electrodes, the first resonator volume having a first thickness dimension between the first and second planar electrodes and comprising piezoelectric material arranged for acoustic vibrations parallel to a propagation axis normal to the first and second planar electrodes;
a second FBAR resonant at the resonant frequency and having a second electrical impedance different from the first electrical impedance, the second FBAR comprising a third planar electrode, a fourth planar electrode, and a second resonator volume between the third and fourth planar electrodes, the second resonator volume having a second thickness dimension between the third and fourth planar electrodes and comprising piezoelectric material arranged for acoustic vibrations parallel to the propagation axis, the second thickness dimension being different from the first thickness dimension; and
an acoustic decoupler between the first FBAR and the second FBAR,
wherein the first and second planar electrodes have a thickness parallel to the propagation axis that is different from a thickness of the third and fourth planar electrodes parallel to the propagation axis, compensating for the difference between the first and second thickness dimensions, so that the second FBAR has substantially the same overall acoustic thickness as the first FBAR parallel to the propagation axis.

* * * * *